US010281972B2

(12) United States Patent
Bemat et al.

(10) Patent No.: US 10,281,972 B2
(45) Date of Patent: May 7, 2019

(54) MEMORY POWER CIRCUITRY

(71) Applicant: HEWLETT PACKARD ENTERPRISE DEVELOPMENT LP, Houston, TX (US)

(72) Inventors: Mohamed Amin Bemat, Houston, TX (US); Ali Salem Ba-Thunya, Houston, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 106 days.

(21) Appl. No.: 15/652,657

(22) Filed: Jul. 18, 2017

(65) Prior Publication Data
US 2019/0025902 A1    Jan. 24, 2019

(51) Int. Cl.
    G06F 1/32      (2006.01)
    G06F 1/3234    (2019.01)
    G11C 5/14      (2006.01)
    G06F 1/3287    (2019.01)
    G06F 1/3296    (2019.01)

(52) U.S. Cl.
    CPC .......... G06F 1/3275 (2013.01); G06F 1/3287 (2013.01); G06F 1/3296 (2013.01); G11C 5/147 (2013.01)

(58) Field of Classification Search
    CPC ................... G11C 5/14; G11C 5/147
    USPC ................................................ 713/323
    See application file for complete search history.

(56) References Cited

U.S. PATENT DOCUMENTS

| | | |
|---|---|---|
| 6,498,759 B2 | 12/2002 | Chang et al. |
| 2006/0294437 A1 | 12/2006 | Washburn et al. |
| 2009/0172442 A1* | 7/2009 | Alexander ............... G06F 1/26 713/323 |
| 2010/0191991 A1 | 7/2010 | Berke et al. |
| 2013/0033953 A1 | 2/2013 | Ge et al. |
| 2014/0333270 A1* | 11/2014 | Young ...................... G05F 1/12 323/234 |
| 2016/0054784 A1* | 2/2016 | Decesaris ............ G06F 1/3206 713/320 |
| 2016/0163480 A1* | 6/2016 | Lester .................... G06F 13/00 713/300 |
| 2018/0218763 A1* | 8/2018 | Bacchus ................. G11C 5/04 |

OTHER PUBLICATIONS

Woligroski, D., "Power Supply 101: A Reference of Specifications," (Web Page), Dec. 14, 2011, 10 pages, available at http://www.tomshardware.co.uk/power-supply-specifications-atx-reference,review-32338-2.html.

* cited by examiner

Primary Examiner — Jaweed A Abbaszadeh
Assistant Examiner — Sumil M Desai
(74) Attorney, Agent, or Firm — Hewlett Packard Enterprise Patent Department

(57) ABSTRACT

A computing device including a motherboard. The motherboard is coupled to a memory socket, a power rail, and a regulator controller. The memory socket is able to couple to a circuit board that includes memory circuitry. The power rail provides a high-voltage power signal to power circuitry on the circuit board. The power rail provides the high-voltage power signal through the memory socket. The regulator controller provides a control signal to power circuitry on the circuit board. The control signal includes a pulse width modulation signal. An output voltage of the power circuitry on the circuit board may be controlled by the control signal.

20 Claims, 9 Drawing Sheets

MEMORY POWER CIRCUITRY

BACKGROUND

Modern computing devices require memory in order to operate. One manner in which memory is provided to a computer is through a separate circuit board containing integrated circuits. The circuit board is coupled to a socket on the motherboard of the computing device, and the computing device communicates with the memory through electrical contacts. Power is also supplied to the memory via electrical contacts. In many computing devices, a power supply generates power at two or three voltages (e.g. 12V and 5V) and supplies them to the computing device through power rails, which are conductors that transmit the power signal to different parts of the computing device. Some memory types require much lower voltages (e.g. 1.2V) to power their circuitry.

BRIEF DESCRIPTION OF THE DRAWINGS

For a more complete understanding of the present disclosure, examples in accordance with the various features described herein may be more readily understood with reference to the following detailed description taken in conjunction with the accompanying drawings, where like reference numerals designate like structural elements, and in which.

Figure 1A:
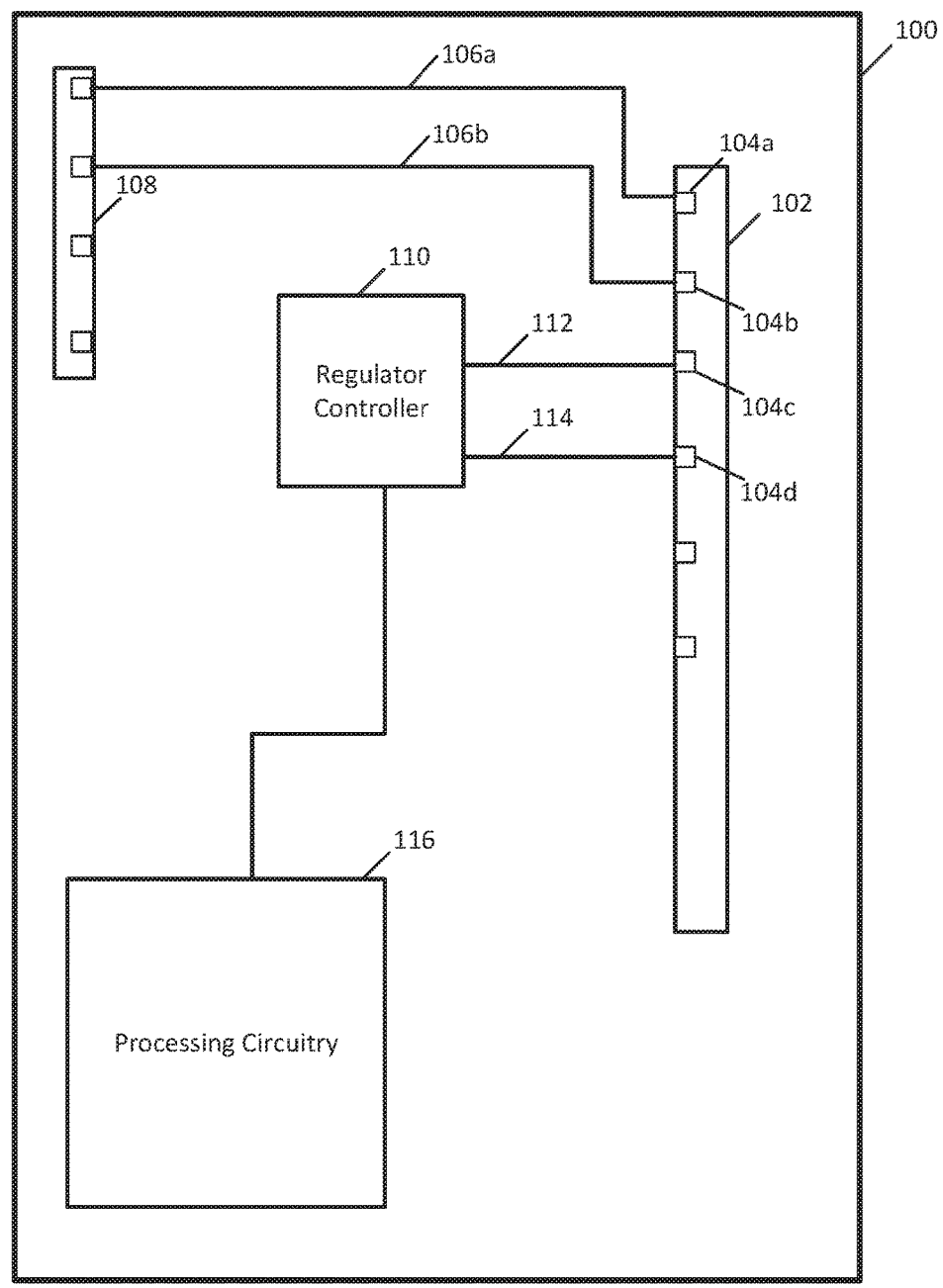
FIGS. 1A-1B illustrate an example motherboard including power supplied to memory sockets.

Certain examples have features that are in addition to or in lieu of the features illustrated in the above-referenced figures.

DETAILED DESCRIPTION

Memory modules have been in constant development, resulting in ever higher capacity and a decrease in power consumption. As the number of transistors on memory modules have increased following Moore's law, memory modules have been forced to be powered by a lower and lower voltage in order to keep power consumption within acceptable operating ranges. However, the lower voltage power signal is more susceptible to interference and distortion as it passes from a motherboard of a computing device to the memory module.

Throughout this disclosure, the term "memory module" refers to a printed circuit board containing memory circuitry and electrical contacts to couple with complementary contacts of a memory socket on a motherboard. Example memory module variants include Single In-Line Memory Module (SIMM) and Dual In-Line Memory Module (DIMM), each of which include various subtypes (e.g. SO-DIMM, MicroDIMM). Memory modules are further classified based on operating specifications, such as clock frequency, transfer rate, and power voltage. For example, Double Data Rate 4 (DDR4) Synchronous Dynamic Random-Access Memory (SDRAM) DIMMs are powered by 1.2 Volts.

When low-voltage power signals are transmitted from a motherboard across electrical contacts to a memory module, there is interference introduced to the signal and the signal degrades due in part to resistance across the electrical contacts. This interference and distortion can result in a power signal outside the operating range of the memory. In some example computing devices, a power signal from a power supply is routed through power rails to a voltage converter including a regulator and then to an output filter. The regulator is controlled by a regulator controller that provides a control signal to the regulator. The power signal is stepped down to a lower voltage suitable for a memory module. For example, a twelve (12) volt power signal may be stepped down to 1.2V for DDR4 SDRAM. Then, once the power is stepped down, it may be transmitted to memory circuitry to power the memory circuitry. In some embodiments, the voltage converter and the output filter are placed on the memory module, and the regulator controller is located on the motherboard, resulting in the control signal and the higher voltage (i.e. not yet stepped down) power signal being routed across the electrical contacts, whereas power circuitry to step down the voltage to a voltage appropriate for memory is collocated with the memory circuitry, substantially reducing the amount of interference and distortion on the more susceptible low-voltage power signal before it is supplied to the memory circuitry. In some examples, certain non-power low-voltage signals may be routed across the electrical contacts, but may be less susceptible to interference and distortion due to characteristics of the low-voltage signals (e.g. low current).

Figure 1B:
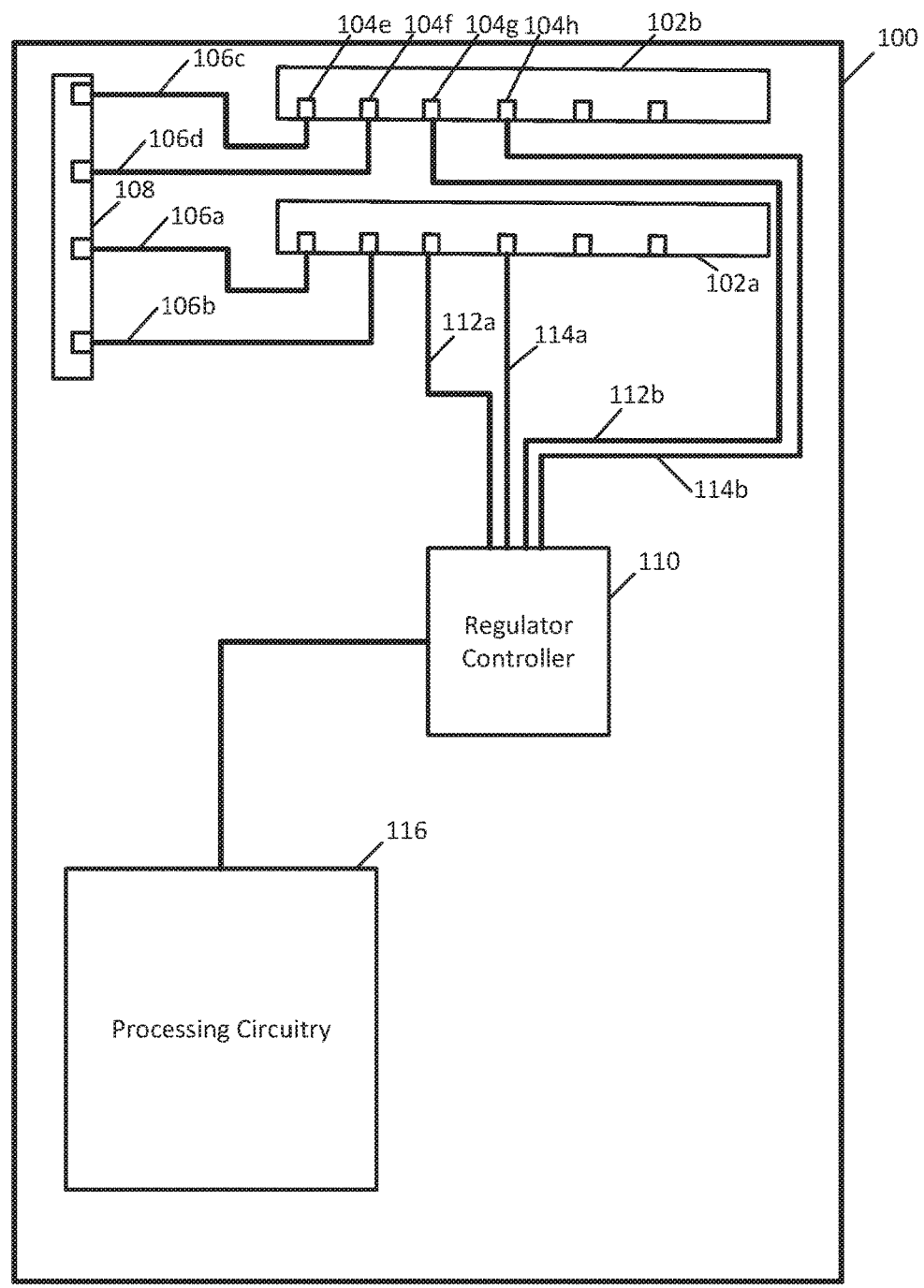

In FIGS. 1A-1B, example circuit boards ("motherboards") of computing devices are illustrated. FIG. 1A illustrates an example motherboard including one memory socket. FIG. 1B illustrates an example motherboard including two memory sockets. However, it is anticipated that a motherboard may include any number of memory sockets.

FIG. 1A illustrates an example motherboard 100 of a computing device containing one memory socket 102. Memory socket 102 may be a component soldered to motherboard 100. In some examples, memory socket 102 includes retaining clips to retain a memory module in memory socket 102. On some example motherboards 100, memory socket 102 may be a certain length complementary to a form factor of one type of memory module. On some other example motherboards 100, memory socket 102 is a different certain length complementary to a form factor of another type of memory module. For example, memory socket 102 may correspond to a 144-pin DIMM. Memory socket 102 may be plastic and substantially rectangular. In some examples, memory socket 102 contains a long channel suitable to receive a substantially planar memory module.

Memory socket 102 may contain contacts 104. In some examples, contacts 104 are arranged along the long channel of memory socket 102 so that they may be coupled to complementary contacts of a memory module when the memory module is retained in memory socket 102. Some example memory sockets 102 have contacts 104 only on one side, whereas some other example memory sockets 102 have contacts 104 on opposing sides of the long channel. Memory socket 102 may have duplicate contacts 104 on opposing sides of the long channel (e.g. corresponding contacts 104 on opposing sides of the long channel are electrically coupled), or may have differing contacts 104 on opposing sides of the long channel. In some examples, memory socket 102 contains one-hundred forty four (144) contacts. However, the disclosure contemplates memory socket 102 containing any number of contacts 104, as is appropriate. For the purposes of clarity, not all contacts 104 are illustrated or described in this disclosure.

In some examples, certain contacts 104 are coupled to power rails 106 to transmit a power signal from motherboard 100 to a memory module coupled to memory socket 102. For example, power rail 106a is coupled to contact 104a and power rail 106b is coupled to contact 104b. Power rails 106 may supply power signals from power supply 108 (power supply 108 is represented as a socket with contacts in FIGS. 1A-1B, but this disclosure contemplates power supply 108 residing on motherboard 100, connecting to motherboard 100 through a socket, or any other appropriate arrangement that results in power supply 108 providing power to motherboard 100). For example, power rail 106a provides a twelve (12) volt direct current power signal to contact 104a and power rail 106b provides a five (5) volt direct current power signal to contact 104b. Although power source 108 may supply power to many components of the computing device at various voltages, it is beyond the scope of this disclosure, and is therefore not illustrated in FIG. 1.

Although power supply 108 provides a power signal nominally at a certain voltage for each power rail 106, operating environmental characteristics, including load on other power rails 106 can affect the voltage on a certain power rail 106. In some examples, the actual voltage on a power rail 106 may be different from the nominal voltage. Similarly, in certain examples power signals from power rails 106 may be converted by a converter to a different voltage. Due to similar circumstances, the actual voltage of a converted power signal from a converter may be different from the nominal voltage that the converter is intended to output. For example, a regulator controller may use information about a power signal to send a control signal to a regulator, and the regulator adjusts the voltage of the power signal based on the control signal. In some examples, the regulator adjusts the voltage of the power signal by adjusting the duty cycle of a PWM square wave power signal before supplying the PWM square wave power signal to an output filter. Regulator controller may receive a feedback signal from the output filter and adjust a duty cycle of a pulse width modulation (PWM) control signal to control the regulator. For example, if the feedback signal indicates that the power signal is a lower voltage than the nominal voltage, the regulator controller may increase the duty cycle of the PWM control signal, causing the power signal's voltage to raise. Likewise, if the power signal is a higher voltage than the nominal voltage, regulator controller may decrease the duty cycle of the PWM control signal, causing the power signal's voltage to lower.

In some examples, motherboard 100 contains one regulator controller. In certain examples, a signal regulator controller may control multiple different regulators. In some other examples, multiple regulator controllers are attached to motherboard 100, each controlling one or more regulators, which may be for different systems of the computing device. Specifically, an example motherboard 100 may include a regulator controller 110 to control a regulator of a memory module. Regulator controller 110 may be coupled to contacts 104 of memory socket 102. For example, control line 112 is coupled to contact 104c and feedback line 114 is coupled to contact 104d. When a memory module is secured in memory socket 102, regulator controller 110 may receive a feedback signal on feedback line 114 from the memory module that is a smoothed power signal from an output filter on the memory module. Regulator controller 110 may also send a control signal on control line 112 consisting of a PWM signal with a duty cycle configured to adjust the regulated power signal on the memory module. Regulator controller 110 may also be coupled to processing circuitry 116 of motherboard 100, providing a control signal to a regulator associated with processing circuitry 116.

In certain examples consistent with FIG. 1A, signal lines (e.g. power rails 106 and lines 112 and 114) are printed traces on a printed circuit board (e.g. motherboard 100). In certain other examples, components of the computing device that are shown as separate in FIG. 1 may be collocated on an integrated circuit or located on another printed circuit board, as appropriate.

In FIG. 1B, another example motherboard 100 is illustrated containing two memory sockets 102. In some examples, the motherboard 100 illustrated in FIG. 1B is the same motherboard 100 illustrated in FIG. 1A, but with more detail illustrated. Certain labels are omitted from FIG. 1B for clarity's sake. A first memory socket 102a and a second memory socket 102b may be coupled to motherboard 100. In some examples, memory sockets 102 are aligned in a row, permitting retained memory modules to be arranged side by side. Memory sockets 102 each may contain contacts 104. For example, memory socket 102b contains contacts 104e-h. Each contact 104 may be designated for a specific purpose. For example, contact 104e is coupled to power rail 106c that provides a twelve (12) volt direct current power signal, contact 104f is coupled to power rail 106d that provides a five (5) volt direct current power signal, contact 104g is coupled to control line 112b that provides a regulator control signal, and contact 104h is coupled to feedback line 114b that receives a feedback signal.

In some examples, certain contacts 104 are coupled to power rails 106 to transmit a power signal from motherboard 100 to a memory module. For example, power rail 106c is coupled to a contact 104e of memory socket 102b and power rail 106d is coupled to contact 104f of memory socket 102b. In another example, power rails 106a-b are coupled to contacts of memory socket 102a. Power rails 106 may supply power signals from power supply 108 (power supply 108 is represented as a socket with contacts in FIGS. 1A-1B, but this disclosure contemplates power supply 108 residing on motherboard 100, connecting to motherboard 100 through a socket, or any other appropriate arrangement that results in power supply 108 providing power to motherboard 100). For example, power rail 106c provides a twelve (12) volt direct current power signal to contact 104e and power rail 106d provides a five (5) volt direct current power signal to contact 104f. Although power source 108 may supply power to many components of the computing device at various voltages, it is beyond the scope of this disclosure, and is therefore not illustrated in FIG. 1.

Although power supply 108 provides a power signal nominally at a certain voltage for each power rail 106, operating environmental characteristics, including load on other power rails 106 can affect the voltage on a certain power rail 106. In some examples, the voltage on a power rail 106 may be different from the nominal voltage. Similarly, in certain examples power signals from power rails 106 are converted to a different voltage. Due to similar circumstances, the converted power signal from a converter may be different from the nominal voltage.

In some examples, regulator controller 110 uses information about the power signals to send control signals to regulators. A regulator adjusts the voltage of a power signal based on the control signal. Regulator controller 110 may receive feedback signals from output filters and adjust a duty cycle of a pulse width modulation (PWM) control signal to control each regulator. For example, if the feedback signal indicates that the power signal is a lower voltage than the nominal voltage, regulator controller 110 increases the duty cycle of the PWM control signal, causing the power signal's voltage to raise. Likewise, if the power signal is a higher voltage than the nominal voltage, regulator controller 110 may decrease the duty cycle of the PWM control signal, causing the power signal's voltage to lower.

Regulator controller 110 may control multiple memory regulators. For example, regulator controller 110 is coupled to memory socket 102a (through control line 112a and feedback line 114a) and is also coupled to memory socket 102b (through control line 112b and feedback line 114b). In some examples, memory sockets 102 are all connected to one power supply 108. The power signals supplied via power rails 106 may rise and fall based on the combined load on power supply 108. For example, when a memory module retained in memory socket 102a temporarily receives increased power, power supply 108 may supply a power signal to a memory module retained in memory socket 102b that is lower than the nominal power signal. Regulator controller 110 may then adjust the control signal supplied to memory socket 102b through control line 112b upon receiving a feedback signal through feedback line 114b that indicates a reduced voltage of the power signal supplied to the memory module retained in memory socket 102b. In some examples, regulator controller 110 only adjusts the control signal when the feedback signal falls outside a threshold range corresponding to an input power signal operating range of memory circuitry of a memory module. For example, memory circuitry of the memory module retained in memory socket 102b may have a power signal operating range of 1.2±0.05V. Regulator controller 110 may receive a converted, smoothed power signal from an output of power circuitry of the memory module as the feedback signal on feedback line 114b. Regulator controller 110 may detect that the feedback signal is approaching one of the extremes of the memory module power signal operating range (e.g. 1.25V, 1.16V). Once the feedback signal passes a threshold value (e.g. 1.225V, 1.185V), regulator controller 110 may alter the duty cycle of the control signal on control line 112b to adjust the regulator on the memory module, adjusting the power signal from the output of the power circuitry closer to the nominal voltage (i.e. 1.2V).

In another example, regulator controller 110 adjusts the control signal dynamically based on the feedback signal. For example, memory circuitry of the memory module retained in memory socket 102b may have a nominal power signal input voltage of 1.2V. Regulator controller 110 may receive a converted, smoothed power signal from an output of power circuitry of the memory module as the feedback signal on feedback line 114b. Regulator controller 110 may adjust the duty cycle in proportion to the feedback signal, resulting in a negative feedback loop that adjusts the power signal toward the nominal voltage.

Along with controlling the power to memory modules, regulator controller 110 may also control power supplied to processing circuitry 116. In some examples, power source 108 is coupled to processing circuitry 116 in the same way as power source 108 is coupled to memory sockets 102, resulting in the power signal supplied to processing circuitry 116 varying like described in relation to memory sockets 102. Regulator controller 110 may receive a feedback signal from processing circuitry 116 and supply a control signal to processing circuitry 116 while simultaneously controlling memory modules.

Figure 2:
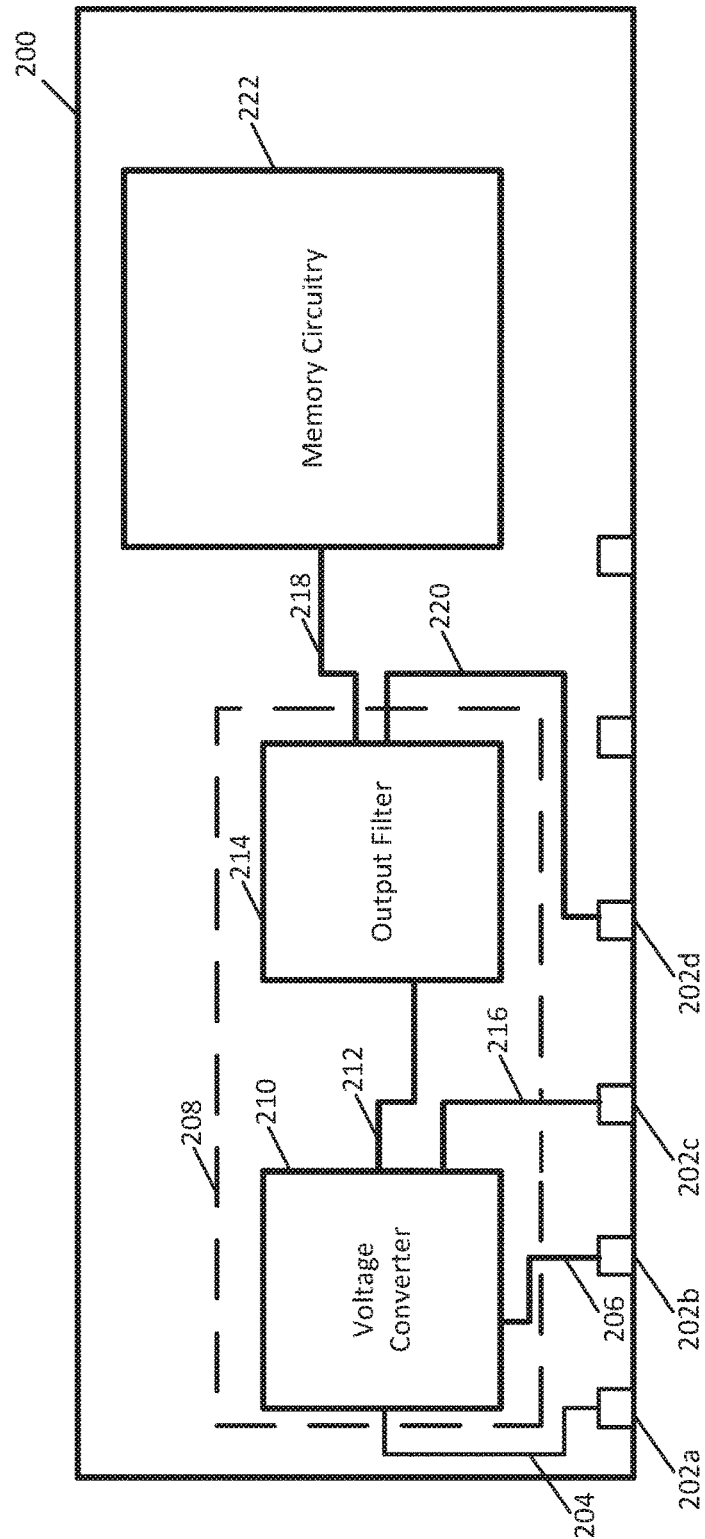
FIG. 2 illustrates an example memory circuit board including power circuitry and memory circuitry.

FIG. 2 illustrates an example memory module, including circuit board 200. Circuit board 200 may include contacts 202. In some examples, contacts 202 are complementary to contacts on a motherboard such that when the memory module is retained in a memory socket on the motherboard, contacts 202 electrically couple to the complementary contacts in the memory socket. Circuit board 200 may include retaining elements (e.g. notches) that receive complementary retaining elements (e.g. latches) when circuit board 200 is retained in a memory socket, holding circuit board 200 in place relative to the contacts in the memory socket. As described in relation to contacts 104 in FIGS. 1A-1B, each contact 202 is coupled to a line (e.g. power circuitry power line 204, power line 206, control line 216, feedback line 220). For example, contact 202a is connected to power circuitry power line 204 to provide power to power circuitry 208 of the memory module, contact 202b is connected to power line 206 to provide power to memory circuitry 222 of the memory module, contact 202c is connected to control line 216 to adjust the output of the regulator within voltage converter 210, and contact 202d is connected to feedback line 220 to provide the output of an output filter 214 back to a regulator controller of the motherboard.

Power circuitry power line 204 may power components of power circuitry 208. In some examples, voltage converter 210 of power circuitry 208 receives a power signal on power line 206 and converts the voltage of the power signal to an output voltage on intermediate power line 212. The voltage on intermediate power line 212 may be a PWM square wave power signal with a peak-to-peak voltage substantially similar to a direct current voltage of the power signal on power line 206.

In order to reduce the deviation from the voltage required to power memory circuitry 222, a regulator of voltage converter 210 may regulate the PWM square wave power signal based on a control signal received on control line 216 from a regulator controller on a motherboard. For example, memory circuitry 222 may require 1.2V as power. Depending on the power signal on power line 206, the power signal transmitted on power output line 218 may be more than 1.2V or less than 1.2V. The control signal may be a pulse width modulation (PWM) signal with the duty cycle of the signal controlling the manner in which the regulator adjusts the PWM square wave power signal and outputs it on intermediate power line 212. Output filter 214 may receive the PWM square wave power signal from voltage converter 210 and smooth the PWM square wave power signal into a substantially direct current low-voltage power signal, For example, output filter 214 may average the PWM square wave power signal over a period of time, and output the average voltage. In some examples, the PWM square wave power signal is a 10% duty cycle 12 volt square wave, and output filter 214 smooths the PWM square wave power signal into a 1.2 volt direct current low-voltage power signal. Output filter 214 may also transmit a feedback signal at a same voltage as the low-voltage power signal to the regulator controller on the motherboard on feedback line 220, allowing the regulator controller to modify the control signal based on the feedback signal. In some examples, the feedback signal (which is at the same voltage as the low-voltage power signal) travels across an electrical contact, but the feedback signal has such a small current that the amount of interference and distortion accumulated on the feedback signal once it reaches the regulator controller is negligible.

Since voltage converter 210 and output filter 214 are components of circuit board 200, low-voltage power signals supplied to memory circuitry 222 may be transmitted across internal traces on circuit board 200 (e.g. intermediate power line 212 and power output line 218) without traversing an interconnection between contacts 202 and complementary contacts on the motherboard, thus reducing their susceptibility to interference and distortion as compared to power signals transmitted across an interconnection.

Figure 3A:
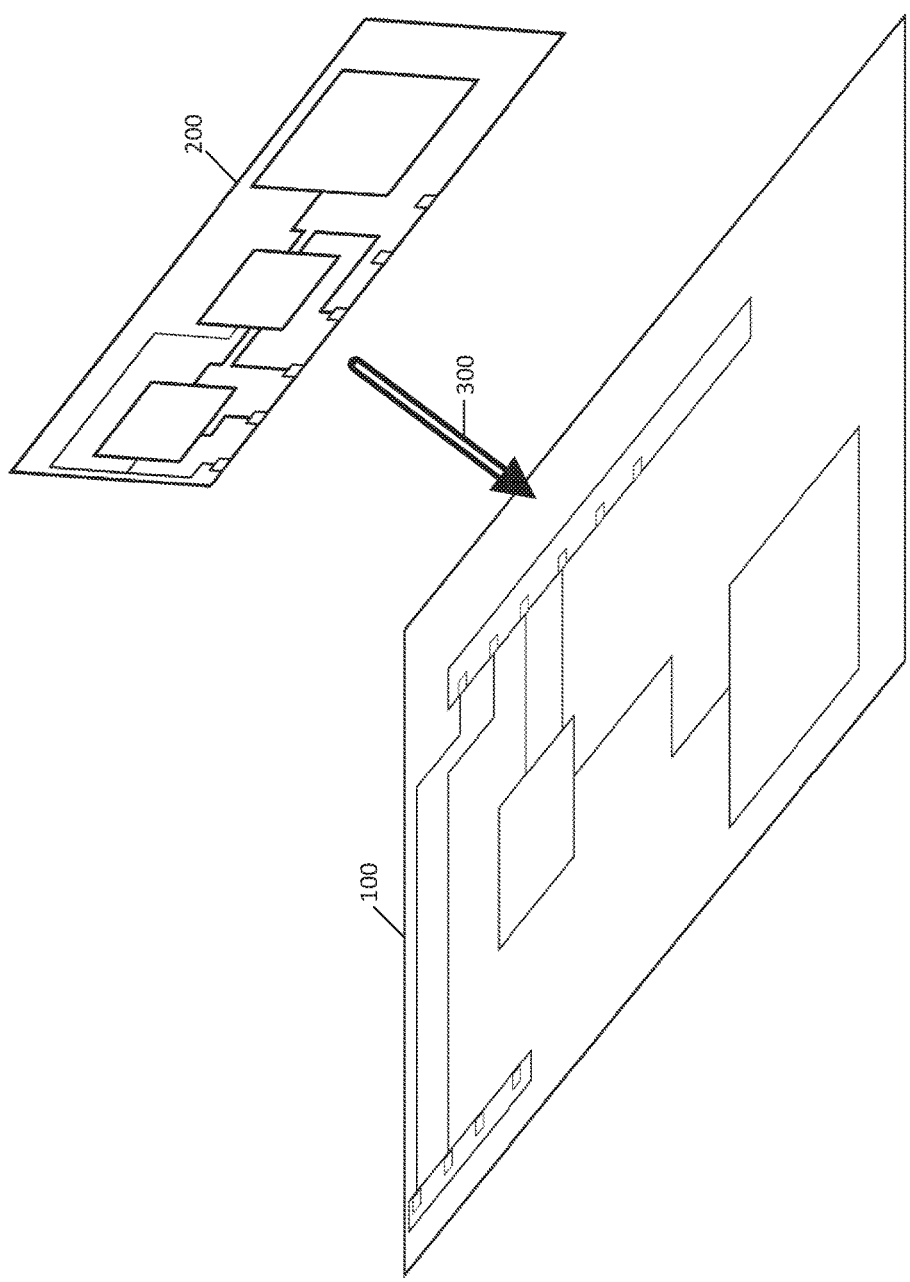
FIGS. 3A-3B illustrate an example memory circuit board received in a memory socket of an example motherboard.
Figure 3B:
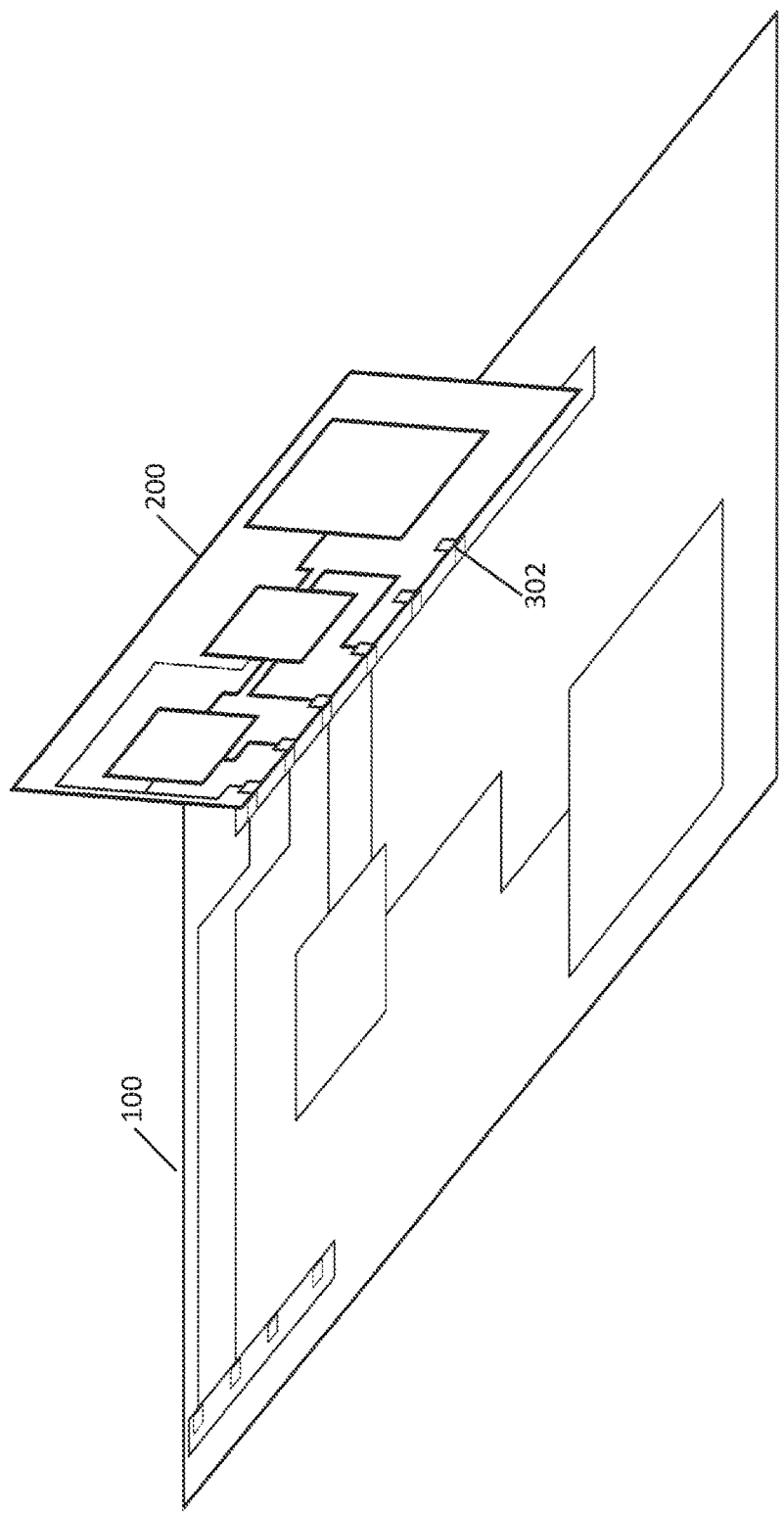

FIGS. 3A-3B illustrate an example memory module being retained in an example motherboard. Although the example motherboard in FIGS. 3A-3B contains one memory socket, it is anticipated that a motherboard may contain any number of memory sockets, as appropriate. Certain labels have been omitted from FIGS. 3A-3B for the sake of clarity.

In FIG. 3A, an example computing device is illustrated, including motherboard 100 and a memory module including circuit board 200. The memory module may be placed in a memory socket of motherboard 100. Placement 300 of the memory module is such that the memory module is retained in the memory socket of motherboard 100 and contacts on the memory module are communicatively coupled to complementary contacts on motherboard 100. In some examples, circuit board 200 of the memory module contains a notch between certain contacts, which is complementary to a protrusion in the memory socket of motherboard 100, preventing the memory module from being inserted backward.

In FIG. 3B, the example computing device is illustrated with the memory module retained in the memory socket. As described in relation to FIG. 3A, interconnection 302 may be formed between a contact of circuit board 200 and a contact of motherboard 100. In some examples, each pair of contacts (i.e. one contact of circuit board 200 and a complementary contact of motherboard 100) is coupled via an interconnection 302. Although interconnection 302 allows a signal to be transmitted across it, due to the materials, shape, and design of the contacts, the signal may be distorted or pick up interference upon crossing interconnection 302. In some examples, a low-voltage signal may be substantially more distorted, in proportion to the signal, than a high-voltage signal.

Figure 4:
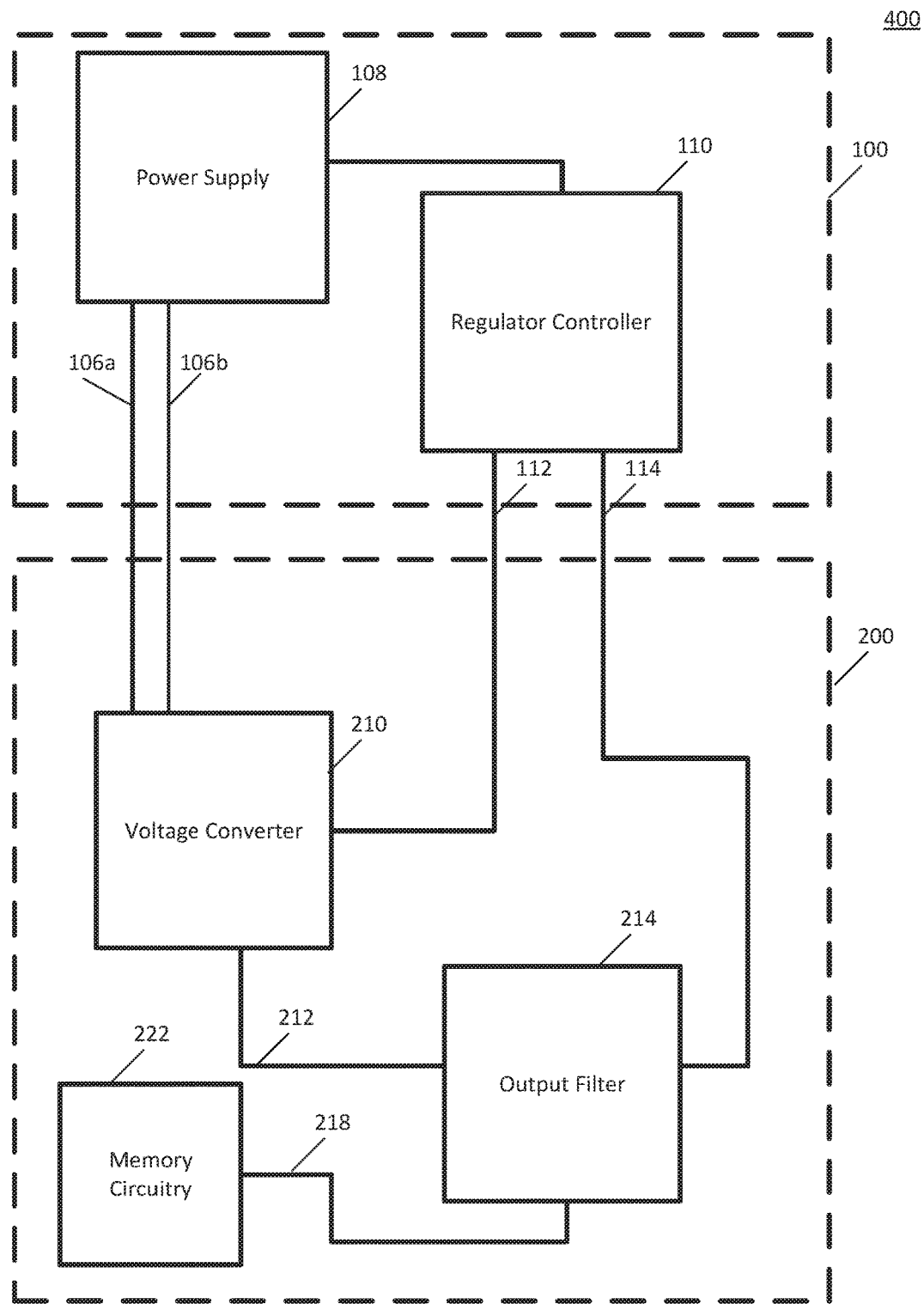
FIG. 4 illustrates an example power system of a computing device.

In FIG. 4 a block diagram of an example power system 400 of a computing device powering a memory module is illustrated including components on a motherboard 100 and a circuit board 200 of a memory module. In some examples, motherboard 100 is coupled to circuit board 200 by power rails 106, control line 112, and feedback line 114. Power supply 108 may supply operating power to regulator controller 110 and voltage converter 210, as well as supplying power to memory circuitry 222 via power system 400.

An example power system 400 initiates power to a memory module as follows. Upon initiation of power, power supply 108 generates a first high-voltage power signal (e.g. twelve (12) volts) and transmits it through power rail 106a. Power supply 108 further generates a second high-voltage power signal (e.g. five (5) volt) and transmits it through power rail 106b. Power supply 108 supplies a power signal to regulator controller 110 and voltage converter 210. Although the connection between power supply 108 and regulator controller 110 is shown as separate from power rail 106b, any power signal generated by power supply 108 may be supplied to each power system 400 component, as is appropriate. In some examples, the regulator controller 110 and voltage converter 210 can receive operational power from the second high-voltage power signal of power rail 106b. In some other examples, power system 400 has only a single operational source voltage (i.e. only twelve (12) volts on power rail 106a), and power for power system 400 is received from the same power rail 106a as the power for memory circuitry 222.

In continuation of the example of the previous paragraph, voltage converter 210 receives the second high-voltage power signal from power rail 106b and the first high-voltage power signal for memory circuitry 222 from power rail 106a. Voltage converter 210 converts the first high-voltage power signal from power rail 106a to a high-voltage PWM square wave power signal with a peak voltage equal to the direct current voltage of the first high-voltage power signal (e.g. 12V). As described in relation to prior figures, although power rail 106a may carry a nominally twelve volt power signal, the actual voltage of the power signal input to voltage converter 210 may differ from the nominal voltage. A regulator of voltage converter 210 receives a control signal from regulator controller 110 via control line 112. The regulator then adjusts the signal output on intermediate power line 212 based on the duty cycle of the control signal. For example, the regulator may adjust the duty cycle of the high-voltage PWM square wave power signal and output a regulated high-voltage PWM square wave power signal on power line 212. An output filter 214 may receive the regulated high-voltage PWM square wave power signal and smooth it. In some examples, output filter 214 averages the regulated high-voltage PWM square wave power signal and outputs a low-voltage power signal at the average voltage of the regulated high-voltage PWM square wave power signal. For example, output filter 214 may receive a regulated high-voltage PWM square wave power signal that is a 10% duty cycle, 12 volt peak square wave and may output a substantially direct current 1.2 volt low-voltage power signal. Output filter 214 may output the low-voltage power signal onto power output line 218. Output filter 214 may also output a feedback signal at the voltage of the low-voltage power signal on feedback line 114 to regulator controller 110. Control line 112 and feedback line 114, in conjunction with voltage converter 210, output filter 214 and regulator controller 110 create a negative feedback loop, wherein variations in the output of output filter 214 (communicated through feedback line 114) are compensated for in the control signal on control line 112, resulting in variations in the low-voltage power signal being attenuated. Output filter 214 then outputs the low-voltage power signal on power output line 218 to memory circuitry 222.

Although an example operation of a power system 400 was discussed in the prior paragraphs, details of the operation of other example power systems 400 within the scope of this disclosure may differ. For example, it is anticipated that voltages on the lines can be any value, as appropriate. As another example, it is anticipated that example power systems 400 may be supplied by any number of different power signals from power supply 108.

As illustrated in FIG. 4, power supply 108 and regulator controller 110 are components of motherboard 100. Further, voltage converter 210, output filter 214, and memory circuitry 222 are components of circuit board 200 of the memory module.

Figure 5:
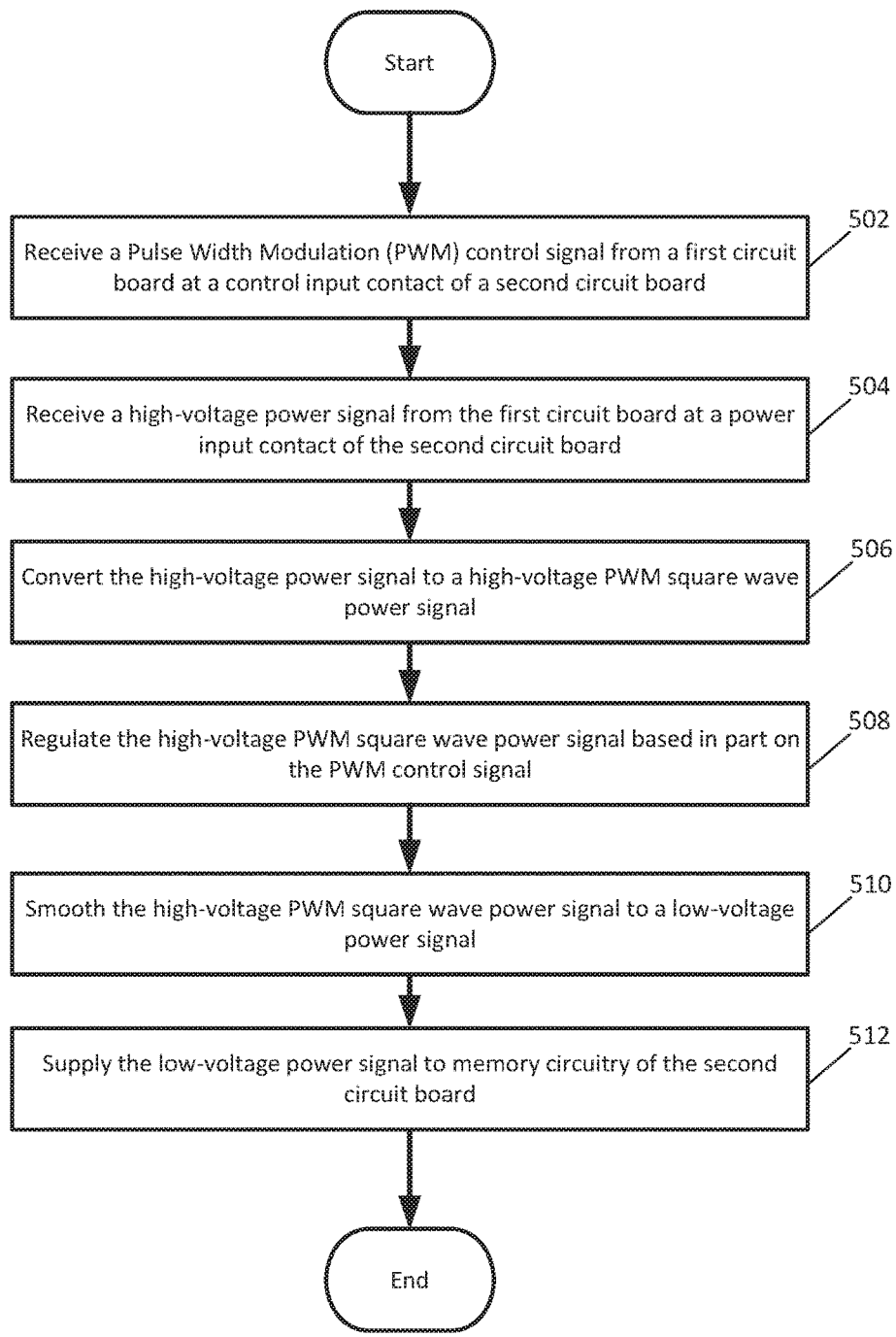
FIG. 5 is a flow chart describing an example method for providing power to memory circuitry.

In FIG. 5, a flowchart is illustrated, showing an example method for providing power to memory circuitry on a memory module. In step 502, a second circuit board receives a pulse width modulation (PWM) control signal at a control input contact. The PWM control signal is sent from a first circuit board. In some examples, the first circuit board is a motherboard and the second circuit board is of a memory module. The control input contact may be one of multiple contacts that are arranged on the second circuit board such that when the second circuit board is retained in a memory socket of the first circuit board, each of the contacts of the second circuit board is electrically coupled to a complementary contact arranged in the memory socket of the first circuit board. The PWM control signal may be generated at a regulator controller on the first circuit board, and a duty cycle of the PWM control signal may be adjusted based on a feedback signal received at the regulator controller.

In step 504, the second circuit board receives a high-voltage power signal at a power input contact. The high-voltage power signal is sent from the first circuit board. The high-voltage power signal may be generated at a power source which may be coupled to the first circuit board. In some examples, the high-voltage power signal is a direct current signal of twelve (12) volts. Although twelve volts may be the nominal voltage level of the high-voltage power signal, interference and other distortion of the signal may result in the actual voltage level of the high-voltage power signal differing from twelve volts. Particularly, the power input contact may be coupled to a complementary contact on the first circuit board, and the interconnection of the power input contact and the complementary contact may create a resistance, which may distort the high-voltage power signal.

In step 506, the high-voltage power signal is converted to a high-voltage PWM square wave power signal. In some examples, the high-voltage power signal is transmitted from the power input contact to a voltage converter on the second circuit board of the memory module. In such examples, the voltage converter converts the high-voltage power signal to the high-voltage PWM square wave power signal and regulates the high-voltage PWM square wave power signal. The voltage converter may receive a second high-voltage power signal for use in powering the circuitry of the voltage converter. Alternatively, the voltage converter may use the high-voltage power signal to both power the circuitry of the voltage converter and output the regulated high-voltage PWM square wave power signal. In some examples, the high-voltage power signal is a direct current signal of twelve volts and the regulated high-voltage PWM square wave power signal is a 10% duty cycle, 12 volt peak square wave. As discussed in relation to step 504, the high-voltage power signal may vary from the nominal voltage value. A regulator of the voltage converter may adjust the duty cycle of the high-voltage PWM square wave power signal to compensate for variations in the high-voltage power signal.

In step 508 the high-voltage PWM square wave power signal is regulated. The regulation of the high-voltage PWM square wave power signal may be based, in part, on the PWM control signal received from the first circuit board. In some examples, the regulated high-voltage PWM square wave power signal is transmitted from the voltage converter on the second circuit board to an output filter on the second circuit board.

The output filter may receive the regulated high-voltage PWM square wave power signal and smooth it. In some examples, the output filter averages the regulated high-voltage PWM square wave power signal and outputs a low-voltage power signal at the average voltage of the regulated high-voltage PWM square wave power signal. For example, the output filter may receive a regulated high-voltage PWM square wave power signal that is a 10% duty cycle, 12 volt peak square wave and may output a substantially direct current 1.2 volt low-voltage power signal. The output filter may output the low-voltage power signal onto a power output line coupled to memory circuitry on the second circuit board. The output filter may also output a feedback signal at the voltage of the low-voltage power signal on a feedback line to a regulator controller on the first circuit board. Since the output filter and the memory circuitry may be collocated on the second circuit board, the low-voltage power signal may be transmitted on a circuit board trace, which introduces less distortion onto the low-voltage power signal than being transmitted across an interconnection of contacts. In some examples, the low-voltage power signal is less than 1.2 volts, and the distortion that would be introduced into the low-voltage power signal by transmission across an interconnection of contacts would make the low-voltage power signal unsuitable for powering memory circuitry. Instead, in such examples, by merely transmitting the low-voltage power signal across a circuit board trace, the low-voltage power signal is distorted comparatively less, resulting in a signal still suitable for powering memory circuitry. The voltage converter and output filter may have a bidirectional information exchange established with the regulator controller on the first circuit board. For example, a regulator of the voltage converter receives a control signal (e.g. the PWM control signal) from the regulator controller through the control input contact, and the output filter sends a feedback signal (e.g. the low-voltage power signal) to the regulator controller through a feedback output contact. This bidirectional communication may create a negative feedback loop, wherein fluctuations in the voltage of the low-voltage power signal result in fluctuations of the duty cycle of the PWM control signal intended to adjust the low-voltage power signal closer to the nominal voltage required to power the memory circuitry. For example, if the low-voltage power signal output from the output filter increases in voltage, the feedback signal will also increase in voltage. This voltage increase is communicated to the regulator controller across the feedback output contact, and the regulator controller modifies the duty cycle of the PWM control signal to adjust the output of the regulator of the voltage converter. The regulator, upon receiving the modified PWM control signal, decreases the duty cycle of the regulated high-voltage PWM square wave power signal. The output filter then averages the regulated high-voltage PWM square wave power signal into a low-voltage power signal with a lower voltage, resulting in the voltage increase being counteracted. A decrease in the voltage of the low-voltage power signal may be handled in a similar manner.

In step 510, the output filter receives the regulated high-voltage PWM square wave power signal from the voltage converter and smooths it into a low-voltage power signal. In some examples, the regulated high-voltage PWM square wave power signal is a 12 volt peak square wave and the low-voltage power signal is a 1.2 volt direct current signal. Output filter may receive the regulated high-voltage PWM square wave power signal and output the average voltage as the low-voltage power signal. In some examples, the output filter includes capacitors to accumulate charge.

In Step 512, the low-voltage power signal is supplied to the memory circuitry of the second circuit board of the memory module. In some examples, the low-voltage power signal is the sole power supplied to the memory circuitry. Alternatively, the low-voltage power signal may be the primary source of power to the memory circuitry, but other high-voltage power signals may be provided for certain portions of the memory circuitry.

Figure 6:
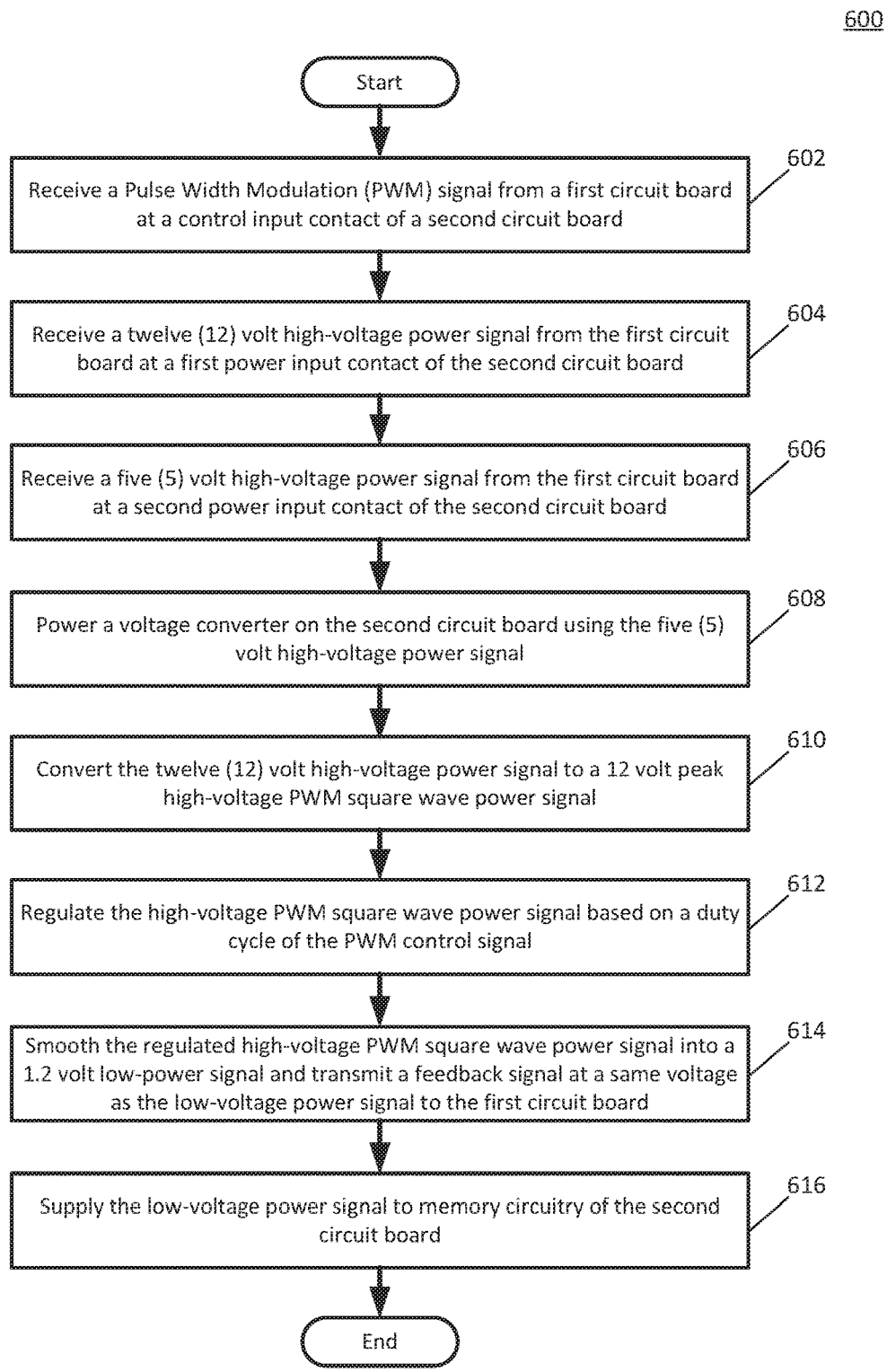
FIG. 6 is a flow chart describing another example method for providing power to memory circuitry.

In FIG. 6, a flowchart is illustrated, showing an example method for providing power to memory circuitry on a memory module. In step 602, a second circuit board receives a pulse width modulation (PWM) control signal at a control input contact. The PWM control signal may be sent from a first circuit board. In some examples, the first circuit board is a motherboard and the second circuit board is of a memory module. The control input contact may be one of multiple contacts that are arranged on the second circuit board such that when the second circuit board is retained in a memory socket of the first circuit board, each of the contacts of the second circuit board is electrically coupled to a complementary contact arranged in the memory socket of the first circuit board. The PWM control signal may be generated at a regulator controller on the first circuit board, and a duty cycle of the PWM control signal may be adjusted based on a feedback signal received at the regulator controller.

In step 604, the second circuit board receives a twelve volt high-voltage power signal at a power input contact. The twelve high-voltage power signal may be sent from the first circuit board. The twelve high-voltage power signal may be generated at a power source which may be coupled to the first circuit board. Although twelve volts may be the nominal voltage level of the twelve volt high-voltage power signal, interference and other distortion of the signal may result in the actual voltage level of the twelve volt high-voltage power signal differing from twelve volts. Particularly, the power input contact may be coupled to a complementary contact on the first circuit board, and the interconnection of the power input contact and the complementary contact may create a resistance, which may distort the twelve volt high-voltage power signal.

In step 606, the second circuit board receives a five volt high-voltage power signal at a second power input contact. The five high-voltage power signal is sent from the first circuit board. The five high-voltage power signal may be generated at a power source which may be coupled to the first circuit board. Although five volts may be the nominal voltage level of the five volt high-voltage power signal, interference and other distortion of the signal may result in the actual voltage level of the five volt high-voltage power signal differing from five volts.

In step 608, a voltage converter on the second circuit board may receive the five volt high-voltage power signal to power the circuitry of the voltage converter.

In step 610, the twelve volt high-voltage power signal is converted to a twelve volt peak high-voltage PWM square wave power signal. In some examples, the twelve volt high-voltage power signal is transmitted from the power input contact to a voltage converter on the second circuit board of the memory module. In such examples, the voltage converter modifies the twelve volt high-voltage power signal to create the twelve volt peak high-voltage PWM square wave power signal. As discussed in relation to step 604, the twelve volt high-voltage power signal may vary from the nominal voltage value, which may result in the twelve volt high-voltage PWM square wave power signal also varying in proportion to the twelve volt high-voltage power signal and any distortion introduced by the voltage converter.

In step 612, the twelve volt high-voltage PWM square wave power signal is regulated. The regulation of the twelve volt high-voltage PWM square wave power signal is based, in part, on a duty cycle of the PWM control signal received from the first circuit board. In some examples, the regulated twelve volt high-voltage PWM square wave power signal is transmitted from the voltage converter on the second circuit board to an output filter on the second circuit board.

The output filter may receive the regulated twelve volt high-voltage PWM square wave power signal and smooth it. In some examples, the output filter averages the regulated twelve volt high-voltage PWM square wave power signal and outputs a 1.2 volt low-voltage power signal at the average voltage of the regulated twelve volt high-voltage PWM square wave power signal. For example, the output filter may receive a regulated high-voltage PWM square wave power signal that is a 10% duty cycle, 12 volt peak square wave and may output a substantially direct current 1.2 volt low-voltage power signal. The output filter may output the 1.2 volt low-voltage power signal onto a power output line coupled to memory circuitry on the second circuit board. The output filter may also output a feedback signal at the voltage of the 1.2 volt low-voltage power signal on a feedback line to a regulator controller on the first circuit board. Since the output filter and memory circuitry may be collocated on the second circuit board, the 1.2 volt low-voltage power signal may be transmitted on a circuit board trace, which introduces less distortion onto the 1.2 volt low-voltage power signal than being transmitted across an interconnection of contacts. In some examples, the 1.2 volt low-voltage power signal is less than 1.2 volts, and the distortion that would be introduced into the 1.2 volt low-voltage power signal by transmission across an interconnection of contacts would make the 1.2 volt low-voltage power signal unsuitable for powering memory circuitry. Instead, in such examples, by merely transmitting the 1.2 volt low-voltage power signal across a circuit board trace, the 1.2 volt low-voltage power signal is distorted comparatively less, resulting in a signal still suitable for powering memory circuitry. The voltage converter and output filter may have a bidirectional information exchange established with the regulator controller on the first circuit board. For example, a regulator of the voltage converter receives a control signal (e.g. the PWM control signal) from the regulator controller through the control input contact, and the output filter sends a feedback signal (e.g. a signal at the voltage of the 1.2 volt low-voltage power signal) to the regulator controller through a feedback output contact. This bidirectional communication may create a negative feedback loop, wherein fluctuations in the voltage of the 1.2 volt low-voltage power signal result in fluctuations of the duty cycle of the PWM control signal intended to adjust the 1.2 volt low-voltage power signal closer to the nominal voltage required to power the memory circuitry. For example, if the 1.2 volt low-voltage power signal output from the output filter increases in voltage, the feedback signal will also increase in voltage. This voltage increase is communicated to the regulator controller across the feedback output contact, and the regulator controller modifies the duty cycle of the PWM control signal to adjust the output of the regulator of the voltage converter. The regulator, upon receiving the modified PWM control signal, reduces the duty cycle of the twelve volt high-voltage PWM square wave power signal. The output filter then averages the regulated twelve volt high-voltage PWM square wave power signal into a 1.2 volt low-voltage power signal with a lower voltage, resulting in the voltage increase being counteracted. A decrease in the voltage of the 1.2 volt low-voltage power signal may be handled in a similar manner.

In step 614, the regulated twelve volt high-voltage PWM square wave power signal is smoothed and a feedback signal is transmitted to the first circuit board. In some examples, the output filter receives the regulated twelve volt high-voltage PWM square wave power signal from the voltage converter and smooths it into a 1.2 volt low-voltage power signal. In some examples, the regulated high-voltage PWM square wave power signal is a 12 volt peak square wave and the low-voltage power signal is a 1.2 volt direct current signal. Output filter may receive the regulated twelve volt high-voltage PWM square wave power signal and output the average voltage as the 1.2 volt low-voltage power signal. In some examples, the output filter includes capacitors to accumulate charge.

The feedback signal is at a same voltage as the 1.2 volt low-voltage power signal. In some examples, the output filter on the second circuit board transmits the feedback signal through a feedback output contact to the regulator controller on the first circuit board.

In step 616, the 1.2 volt low-voltage power signal is supplied to the memory circuitry of the second circuit board of the memory module. In some examples, the 1.2 volt low-voltage power signal is the sole power supplied to the memory circuitry. Alternatively, the 1.2 volt low-voltage power signal may be the primary source of power to the memory circuitry, but other high-voltage power signals may be provided for certain portions of the memory circuitry.

Figure 7:
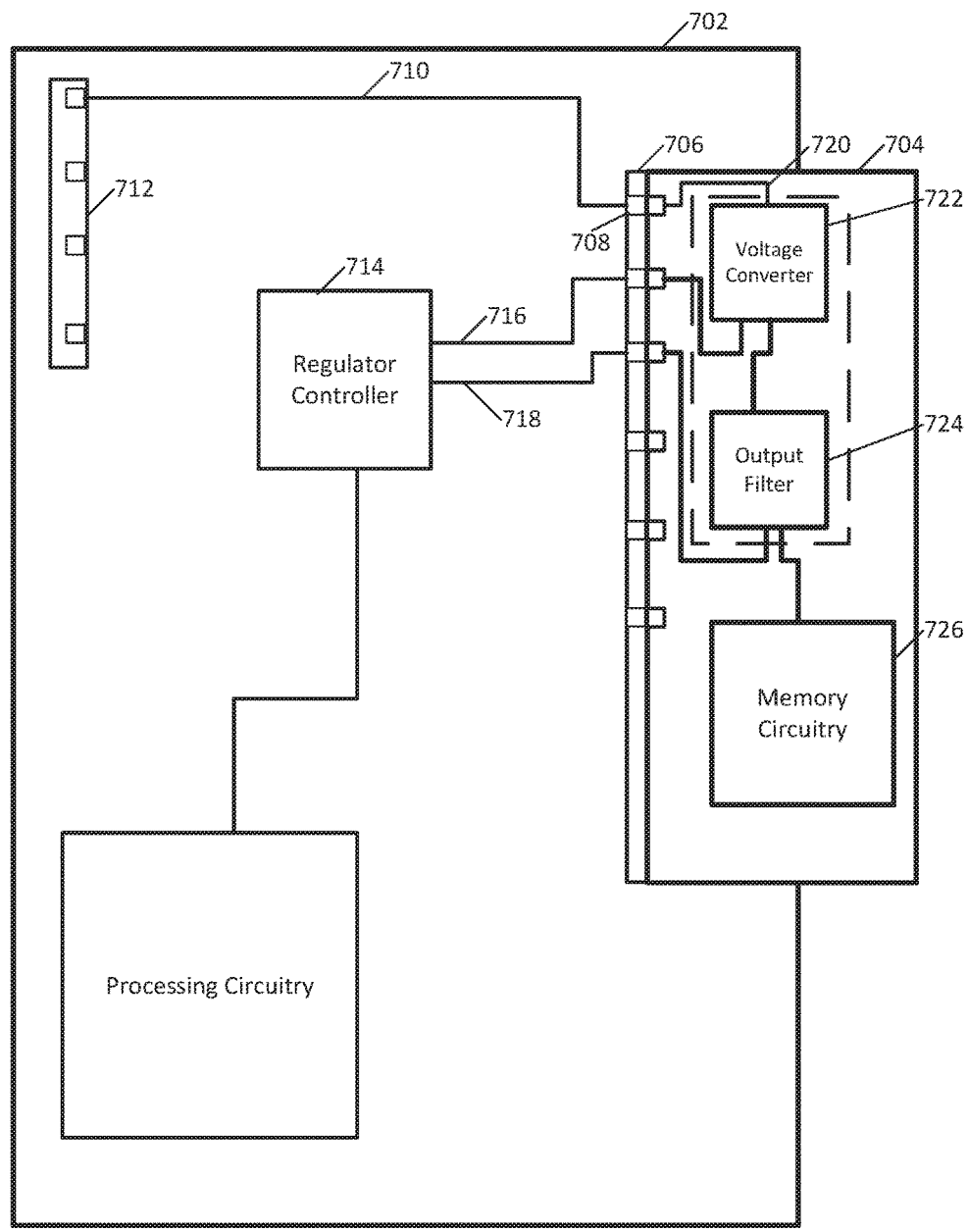
FIG. 7 illustrates an example computing device with a single power rail providing power to a memory circuit board.

In FIG. 7, an example computing device is illustrated with a single power rail powering a memory module. Certain labels have been omitted from FIG. 7 for the sake of clarity. Computing device 700 includes a motherboard 702 and a circuit board 704 of a memory module. Circuit board 704 may couple to motherboard 702 via memory socket 706. Circuit board 704 may be retained in memory socket 706 by any appropriate retention mechanism. Circuit board 704 may be communicatively coupled to motherboard 702 via interconnections 708. An interconnection 708 may contain an electrical contact on circuit board 704 and a complementary electrical contact in memory socket 706 of motherboard 702. When circuit board 704 is retained in memory socket 706, the contact on circuit board 704 may communicatively couple with the complementary contact in memory socket 706, resulting in an electrical pathway between components of motherboard 702 and the memory module.

In some examples, power is supplied to the memory module through motherboard 702. For example, power source 712 provides a power signal through power rail 712, which passes through an interconnection 708 to power rail 720 on circuit board 704 of the memory module. In order to control the power supplied to the memory module, motherboard 702 may contain a regulator controller 714. Regulator controller 714 may establish bidirectional communication with power circuitry on the memory module through control line 716 and feedback line 718.

Power rail 720 on circuit board 704 of the memory module may provide power to a voltage converter 722 on circuit board 704 and an output filter 724 on circuit board 704. Further, voltage converter 722 may convert the high-voltage power signal on power rail 720 to a regulated high-voltage PWM square wave power signal to power memory circuitry 726 of the memory module.

A regulator of voltage converter 722 may regulated the high-voltage PWM square wave power signal. Based in part on the control signal received from regulator controller 714 through control line 716, the regulator of voltage converter 722 may adjust the duty cycle of the regulated high-voltage PWM square wave power signal, resulting in reduced variation in a low-voltage power signal provided to memory circuitry 726 in comparison to the nominal voltage required to power memory circuitry 726. Output filter 724 receives the regulated high-voltage PWM square wave power signal and smooths it to a low-voltage power signal. In order to inform regulator controller 714 about the variations in the low-voltage power signal, output filter 724 may output a feedback signal at the same voltage as the low-voltage power signal to regulator controller 714 through feedback line 718. This may create a negative feedback loop wherein the control signal output by regulator controller 714 attenuates any deviations in the low-voltage power signal from the voltage required to power memory circuitry 726. The low-voltage power signal may be supplied from output filter 724 to memory circuitry 726.

Although the present disclosure has been described in detail, it should be understood that various changes, substitutions and alterations can be made without departing from the spirit and scope of the disclosure. Any use of the words "may" or "can" in respect to features of the disclosure indicates that certain embodiments include the feature and certain other embodiments do not include the feature, as is appropriate given the context. Any use of the words "or" and "and" in respect to features of the disclosure indicates that embodiments can contain any combination of the listed features, as is appropriate given the context.

The invention claimed is:

1. A computing device, comprising:
   a first circuit board coupled to computing components including:
   a memory socket to couple to a second circuit board comprising memory circuitry;
   a power rail to provide a high-voltage power signal through the memory socket to power circuitry on the second circuit board; and
   a regulator controller to provide a control signal through the memory socket to the power circuitry on the second circuit board, wherein the control signal comprises a pulse width modulation (PWM) signal to control an output voltage of the power circuitry on the second circuit board.

2. The computing device of claim 1, wherein the memory socket couples to the second circuit board through an electrically conductive contact.

3. The computing device of claim 1, wherein the high-voltage power signal is a direct current signal of twelve (12) volts.

4. The computing device of claim 1, wherein a different power rail provides a second high-voltage power signal that is a direct current signal of five (5) volts to the power circuitry.

5. The computing device of claim 1, wherein the regulator controller modifies the control signal to balance the output voltage of the power circuitry in comparison to a second output voltage of different power circuitry on a different circuit board.

6. The computing device of claim 1, wherein the regulator controller is coupled to processing circuitry of the computing device to control an output voltage of power circuitry associated with the processing circuitry.

7. A method for supplying power to memory circuitry, comprising:
   from a first circuit board and at a control input contact of a second circuit board containing the memory circuitry, receiving a pulse width modulation (PWM) control signal to control an output voltage of power circuitry on the second circuit board;
   receiving, at a power input contact on the second circuit board, a high-voltage power signal to power the memory circuitry;
   converting, at a voltage converter of the power circuitry on the second circuit board, the high-voltage power signal with a first voltage to a high-voltage PWM square wave power signal;
   regulating, at the voltage converter of the power circuitry on the second circuit board, the high-voltage PWM square wave power signal to the first voltage, based in part on the PWM control signal;

smoothing, at an output filter of the power circuitry on the second circuit board, the regulated high-voltage PWM square wave power signal to a low-voltage power signal with a second voltage; and supplying, from the power circuitry on the second circuit board, the low-voltage power signal to the memory circuitry.

8. The method of claim 7, wherein the high-voltage power signal is a direct current signal of twelve (12) volts.

9. The method of claim 7, further comprising:

receiving, at a second power input contact of the second circuit board, a second high-voltage power signal that is a direct current signal of five (5) volts; and powering the voltage converter of the power circuitry using the second high-voltage power signal.

10. The method of claim 7, wherein regulating the high-voltage PWM square wave power signal comprises adjusting a duty cycle of the high-voltage PWM square wave power signal based on a duty cycle of the PWM control signal.

11. The method of claim 10, wherein the duty cycle of the PWM control signal is adjusted based in part on fluctuations in the low-voltage power signal and power requirements of different memory circuitry.

12. The method of claim 7, wherein the low-voltage power signal is a direct current signal of 1.2 volts.

13. The method of claim 7, further comprising transmitting, from the second circuit board, a feedback signal comprising the low-voltage power signal.

14. A circuit board, comprising:

a power signal input contact to receive a high-voltage power signal;

a control signal input contact to receive a pulse width modulation (PWM) control signal;

power circuitry comprising:

a voltage converter to receive the high-voltage power signal from the power signal input contact, convert the high-voltage power signal into a high-voltage PWM square wave power signal, and regulate the high-voltage PWM square wave power signal; and an output filter to smooth the regulated high-voltage PWM square wave power signal into a low-voltage power signal based on the PWM control signal received from the control signal input contact; and memory circuitry to store data, wherein the memory circuitry receives the low-voltage power signal.

15. The circuit board of claim 14, wherein the voltage converter of the power circuitry regulates the high-voltage PWM square wave power signal by adjusting a duty cycle of the high-voltage PWM square wave power signal based on a duty cycle of the PWM control signal.

16. The circuit board of claim 15, wherein the duty cycle of the PWM signal is adjusted based in part on fluctuations in the low-voltage power signal and power requirements of different memory circuitry.

17. The circuit board of claim 14, wherein the low-voltage power signal provides power to the memory circuitry and wherein the low-voltage power signal is a direct current signal of 1.2 volts.

18. The circuit board of claim 14, wherein the high-voltage power signal is a direct current signal of twelve (12) volts, and wherein the power circuitry also receives a second high-voltage power signal that is a direct current signal of five (5) volts.

19. The circuit board of claim 18, wherein the second high-voltage power signal powers the voltage converter.

20. The circuit board of claim 14, wherein the circuit board further comprises a feedback signal output contact to transmit a feedback signal comprising the low-voltage power signal.

* * * * *